United States Patent
Zou

(10) Patent No.: US 10,299,023 B2
(45) Date of Patent: May 21, 2019

(54) MULTIFUNCTIONAL WIRELESS MUSIC MICROPHONE

(71) Applicant: Shenzhen Sile Technology Co., Ltd., Shenzhen (CN)

(72) Inventor: Mingbing Zou, Shenzhen (CN)

(73) Assignee: Shenzhen Sile Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/112,661

(22) Filed: Aug. 25, 2018

(65) Prior Publication Data

US 2018/0367879 A1 Dec. 20, 2018

Related U.S. Application Data

(63) Continuation of application No. PCT/CN2017/078870, filed on Mar. 30, 2017.

(30) Foreign Application Priority Data

Nov. 9, 2016 (CN) .......................... 2016 1 0986189

(51) Int. Cl.
*H04R 1/08* (2006.01)
*G06F 3/16* (2006.01)
(Continued)

(52) U.S. Cl.
CPC ............... *H04R 1/08* (2013.01); *G06F 3/165* (2013.01); *G10K 15/08* (2013.01); *H02J 7/0029* (2013.01);
(Continued)

(58) Field of Classification Search
CPC ........ H04R 3/04; H04R 1/08; H04R 2410/03; H04R 2420/09; G06F 3/165; G10K 15/08; H02J 7/0029
See application file for complete search history.

(56) References Cited

U.S. PATENT DOCUMENTS

2009/0171913 A1 7/2009 Wen et al.

FOREIGN PATENT DOCUMENTS

CN 201797599 U 4/2011
CN 203801065 U 8/2014
(Continued)

OTHER PUBLICATIONS

Translation of CN201797599, "Digital Wireless Microphone System", Mar. 19, 2010.*

(Continued)

*Primary Examiner* — Regina N Holder
(74) *Attorney, Agent, or Firm* — W&K IP (Wayne & King)

(57) ABSTRACT

A wireless music microphone comprises a central processing unit module, a sound source receiving module, a sound source signal processing module, a sound collecting module, a sound signal processing module, a reverberation processing module and a signal transmitting module. The sound source receiving module receives a song transmitted by devices such as a mobile phone and a tablet computer via a wireless network, the sound source signal processing module removes the original sound from the received music and retains the accompaniment according to a user setting; and a user sound, music or accompaniment is polished and mixed by the reverberation processing module, and is then sent to a loudspeaker box by the signal transmitting module via the wireless network. The multifunctional wireless music microphone is applicable to various wireless communication modes; moreover, the song and user's sound can be effectively mixed, amplified and polished.

7 Claims, 14 Drawing Sheets

(51) Int. Cl.
*G10K 15/08* (2006.01)
*H04R 3/04* (2006.01)
*H02J 7/00* (2006.01)
*H03G 3/30* (2006.01)
*H03G 5/16* (2006.01)
*H04H 60/04* (2008.01)

(52) U.S. Cl.
CPC ........... *H03G 3/3005* (2013.01); *H03G 5/165* (2013.01); *H04H 60/04* (2013.01); *H04R 3/04* (2013.01); *H03G 2201/103* (2013.01); *H04R 2410/03* (2013.01); *H04R 2420/09* (2013.01)

(56) References Cited

FOREIGN PATENT DOCUMENTS

| CN | 104093095 A | 10/2014 |
| CN | 203984620 U | 12/2014 |
| CN | 106254978 A | 12/2016 |

OTHER PUBLICATIONS

Translation of CN104093095, "Singing device with automatically-adjusted volume", Oct. 8, 2014.*
Internation Search Report of PCT/CN2017I078870, dated Jul. 6, 2017.

* cited by examiner

MULTIFUNCTIONAL WIRELESS MUSIC MICROPHONE

CROSS-REFERENCE TO RELATED APPLICATIONS

This application is a continuation of International Patent Application No. PCT/CN2017/078870 with a filing date of Mar. 30, 2017, designating the United States, now pending, and further claims priority to Chinese Patent Application No. 201610986189.5 with a filing date of Nov. 9, 2016. The content of the aforementioned applications, including any intervening amendments thereto, are incorporated herein by reference.

TECHNICAL FIELD

The disclosure relates to the technical field of mobile communication, and particularly to a multifunctional wireless music microphone.

BACKGROUND OF THE PRESENT INVENTION

Most of traditional microphones consist of a microphone, a power amplifier, and an audio player, and are connected to speakers, TVs, etc. via a wired connection, which hence can only functioned for sound amplification. The traditional microphones have many shortcomings, including single function, limited connection modes, and especially being unable to connect with emerging media players such as tablets, mobile phones, and Bluetooth speakers.

In recent years, the appearance of some emerging media-based microphones greatly enriched the functions of the microphone. For example, a Bluetooth microphone for singing with a mobile phone (CN No. 201520471596.3) proposed by Shenzhen Xinhaihui Electronics Co. Ltd. can be used for singing through the Bluetooth microphone, the mobile phone and a Bluetooth speaker. Similarly, a Bluetooth microphone (CN No. 201220185687.7) proposed by Qidong Aipu Electric Appliances Co. Ltd. enables tour grades to move around in a car when introducing the spots. The Bluetooth microphone support is reasonable in design, and can be charged via the USB. The high elastic shock absorbing support is added to the microphone, making the fixed microphone become stable, reliable and safe. As another example, a portable karaoke device and system (CN No. 201520759211.3) is proposed by Shenzhen Maiyue Technology Co. Ltd., and the karaoke device is connected to a terminal device wirelessly, which enables the user to sing at any time and in anywhere, and hence greatly improves the user experience.

Although the above patents and related technologies have been improved and upgraded for traditional microphones, many shortcomings still exist. For example, the wireless communication modes of the existing microphones are limited, and hence unable to cover Wifi, Bluetooth etc. completely. The above microphones lack the song storage function, the music and voice mixing function, and especially the original sound removing function, which have not been disclosed in any related references till now.

SUMMARY OF PRESENT INVENTION

An object of the present disclosure is to provide a multifunctional wireless music microphone which is not only applicable to various wireless communication modes, but also capable of mixing, amplifying and polishing the song and the user's sound effectively, so that the original sound of song can be adjustably removed; and the multifunction wireless music microphone can be widely applied to many scenarios, such as car loudspeaker box entertainment or outdoor loudspeaker box entertainment or indoor presentations or indoor conferences.

In order to achieve above object, the technical solutions adopted in the disclosure are as follows:

A multifunctional wireless music microphone comprises: a central processing unit module, a sound collecting module, an output signal processing module, a signal transmitting module, a sound source receiving module, a sound source signal processing module, a reverberation processing module, a sound signal processing module, and a power source module; the sound source receiving module, the sound source signal processing module, the reverberation processing module, the sound signal processing module and the power source module are connected to the central processing unit module respectively; the sound source receiving module is connected to an accompaniment input end of the reverberation processing module via the sound source signal processing module; the sound collecting module is connected to a sound input end of the reverberation processing module via the sound signal processing module; the output end of the reverberation processing module is connected to the signal transmitting module via the output signal processing module; the sound source receiving module comprises one or more of the following receiving circuits: a Bluetooth receiving circuit, an FM receiving circuit and a Wifi receiving circuit; the signal transmitting module comprises one or more of the following transmitting circuits: a Bluetooth transmitting circuit, an FM transmitting circuit and a Wifi transmitting circuit.

Advantageously, the multifunctional wireless music microphone further comprises a storage module and a display controlling module; the storage module and the display controlling module are respectively connected to the central processing unit module; the display controlling module is connected to a physical button, a display screen or a touch screen on the microphone; and the storage module comprises one or more of the following read/write circuits; a USB read/write circuit, a TF card read/write circuit and an SD card read/write circuit.

Advantageously, the sound source signal processing module comprises a channel selection circuit and an original sound removing circuit; the channel selection circuit includes a selection controlling end, an external sound source receiving end, an internal sound source receiving end, a sound deadening output end, and a direct output end; the selection controlling end is connected to the central processing unit module; the external sound source receiving end is connected to the sound source receiving module; the internal sound source receiving end is connected to the central processing unit module for receiving music stored in the storage module; a sound deadening output end is connected to an input end of the original sound removing circuit; an output end of the original sound removing circuit is connected to the reverberation processing module; and the direct output end is connected to the reverberation processing module.

Advantageously, the reverberation processing module comprises a variable gain amplifying circuit and a mixing processing circuit; the variable gain amplifying circuit comprises a gain controlling end, an accompaniment input end, a sound input end, an accompaniment output end, and a sound output end; the gain controlling end is connected to the central processing unit module; the accompaniment input end is connected to the sound source signal processing module; the sound input end is connected to the sound signal processing module; the accompaniment output end is connected to a first input end of the mixing processing circuit, the sound output end is connected to a second input end of the mixing processing circuit; and an output end of the mixing processing circuit is connected to the output signal processing module.

Advantageously, the original sound removing circuit comprises a left/right channel balancing unit, a first adding circuit, an adjustable low-pass filtering circuit, a controllable differential amplifying circuit and a second adding circuit; the left/right channel balancing unit includes a sound deadening input end, a left channel signal output end and a right channel output end; the right and left channel output ends each is connected to a first input end of the second adding circuit via the first adding circuit and the adjustable low-pass filtering circuit; the right and left channel input ends each is connected to a second input end of the second adding circuit via the controllable differential amplifying circuit; an output end of the second adding circuit is connected to the accompaniment input end of the mixing processing circuit; and controlling ends of the adjustable low-pass filtering circuit and the controllable differential amplifying circuit are connected to the central processing unit module, respectively.

Advantageously, the sound signal processing module comprises a sound signal adjusting circuit, a howling suppressing circuit and a timbre processing circuit; the sound collecting module is connected to the sound input end of the reverberation processing module via the sound signal adjusting circuit, the howling suppressing circuit and the timbre processing circuit in sequence; the sound source signal processing module further comprises a dentilabial sound removing circuit arranged after the original sound removing circuit, and the dentilabial sound removing circuit includes an input end and an output end; the input end of the dentilabial sound removing circuit is connected to the output end of the original sound removing circuit; and the output end of dentilabial sound removing circuit is connected to the accompaniment input end of the reverberation processing module.

Advantageously, the reverberation processing module comprises an A/D converting circuit connected between the variable gain amplifying circuit and the mixing processing circuit; the output signal processing module comprises a D/A converting circuit and a mixing signal adjusting circuit; an input end of the D/A converting circuit is connected to the mixing processing circuit; and an output end of the D/A converting circuit is connected to the signal transmitting module via the mixing signal adjusting circuit.

As a further improvement of the above technical solutions, the multifunctional wireless music microphone further comprises an angle sensor module and a battery management module, wherein the angle sensor module is connected to the central processing unit module and the battery management module is connected to the central processing unit module and the power source module, respectively.

Advantageously, the battery management module comprises a protection circuit, a voltage sensor and a buzzer; a switch of the protection circuit is arranged between the power source module and an external charging power source; and the voltage sensor and the buzzer are connected to the central processing unit module, respectively.

The present disclosure discloses a multifunctional wireless music microphone, belongs to the fields of wireless communication and audio processing. The wireless music microphone comprises a central processing unit module, a sound source receiving module, a sound source signal processing module, a sound collecting module, a sound signal processing module, a reverberation processing module and a signal transmitting module. The sound source receiving module receives a song transmitted by devices such as a mobile phone and a tablet computer via a wireless network, the sound source signal processing module removes the original sound from the received music and retains the accompaniment according to a user setting; and the user's sound, music or accompaniment is polished and mixed by the reverberation processing module, and is then sent to a loudspeaker box by the signal transmitting module via the wireless network. The multifunctional wireless music microphone provided in the present disclosure is applicable to various wireless communication modes and capable of mixing, amplifying and polishing the song and the user's sound effectively, so that the original sound of song can be adjustably removed; and the multifunction wireless music microphone can be widely applied to many scenarios, such as car loudspeaker box entertainment or outdoor loudspeaker box entertainment or indoor presentations or indoor conferences.

DESCRIPTION OF THE DRAWINGS

In order to make the technical solutions in the disclosure described more clearly, the drawings associated to the description of the embodiments will be illustrated concisely in the following. Obviously, the drawings described below are only some embodiments according to the disclosure, and more drawings will be obtained by one of ordinary skill in the art based on the drawings described in the disclosure without paying any creative work.

DETAILED DESCRIPTION OF PREFERRED EMBODIMENTS

In the description of the disclosure, the orientation or positional relationship indicated by the terms "center", "upper", "lower", "front", "back", "left", "right", "vertical", "horizontal", "top", "bottom", "inside", "outside" ect. are based on of the orientation or positional relationship shown in the accompanying drawings. It should be noted that these terms are merely for the purpose of describing the present disclosure and simplifying description, rather than indicating or implying that the device or component must be in a particular orientation, or must be constructed or operated in a particular orientation. Therefore, these terms are not for the purpose of limiting the disclosure.

The terms "first" and "second" are merely for the purpose of description and can not be construed as indicating or implying a relative importance or the number of technical features. Thus, features defined with "first" and "second" may include one or more of the features. In the description of the disclosure, "a plurality of" means two or more unless otherwise illustrated.

Figure 1:
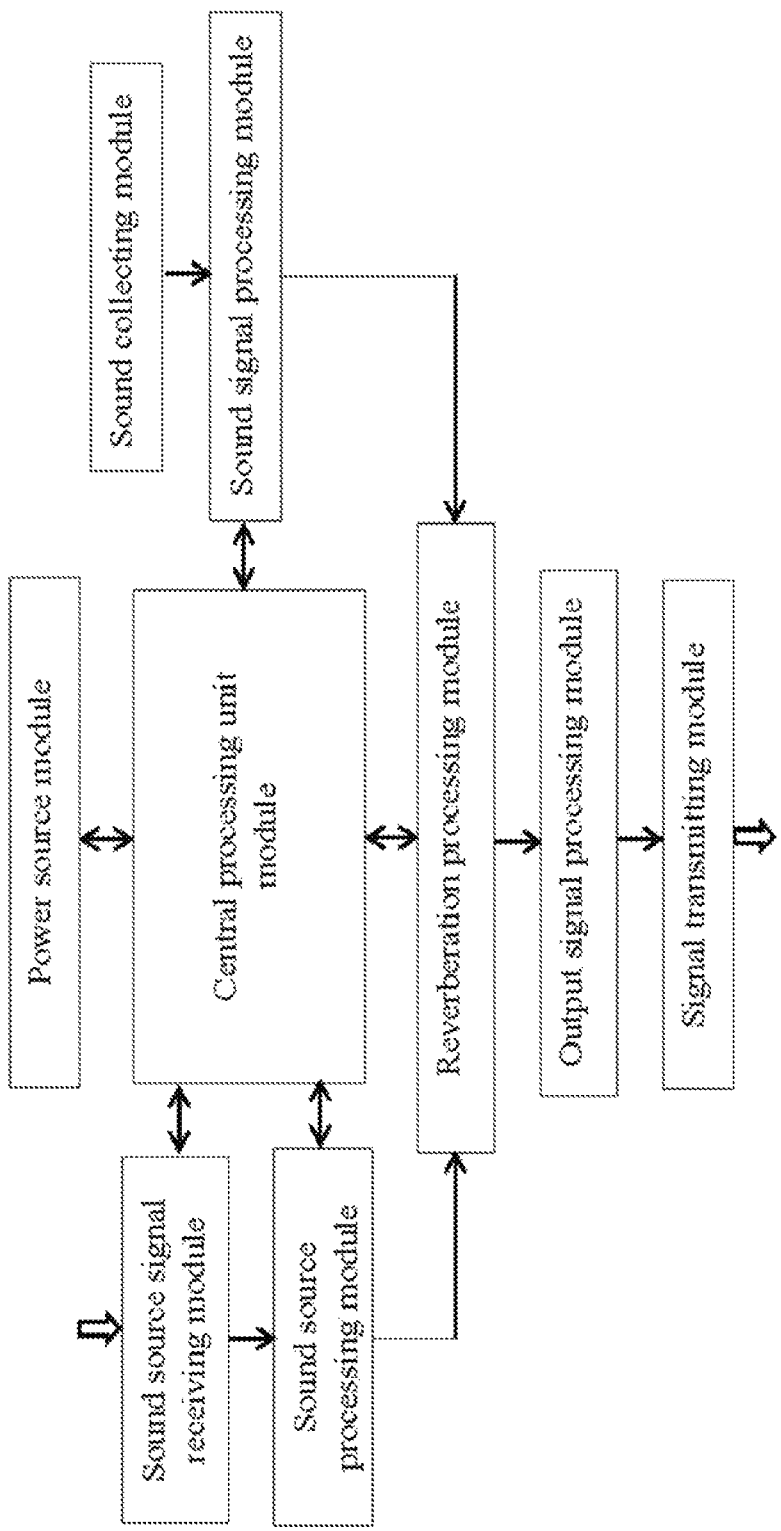
FIG. 1 is a principle diagram of a multifunction wireless music microphone according to the disclosure.

The present disclosure will now be described more clearly and fully with reference to the accompanying drawings. Referring to FIG. 1, a multifunctional wireless music microphone comprises: a central processing unit module, a sound collecting module, an output signal processing module, a signal transmitting module, as sound source receiving module, a sound source signal processing module, a reverberation processing module, a sound signal processing module, and a power source module. The sound source receiving module, the sound source signal processing module, the reverberation processing module, the sound signal processing module and the power source module face connected to the central processing unit module respectively.

The sound source receiving module is connected to a music accompaniment input end of the reverberation processing module via the sound source signal processing module. The sound collecting module is connected to a sound input end of the reverberation processing module via the sound signal processing module. The output end of the reverberation processing module is connected to the signal transmitting module via the output signal processing module.

The sound source receiving module comprises one or more of the following receiving circuits: a Bluetooth receiving circuit, an FM receiving circuit and a Wifi receiving circuit. The signal transmitting module comprises one or more of the following transmitting circuits: a Bluetooth transmitting circuit, an FM transmitting circuit and a Wifi transmitting circuit.

Specifically, a storage module and a display controlling module can be added to the multifunctional wireless music microphone according to actual situation. The storage module and the display controlling module are respectively connected to the central processing unit module, and the display controlling module is respectively connected to a physical button, a display screen or touch screen on the multifunctional wireless music microphone. The storage module comprises one or more of the following read/write circuits: a USB read/write circuit, a TF card read/write circuit and an SD card read/write circuit.

It should be noted that the sound source receiving module and the signal transmitting module can be integrated together or use corresponding signal receiving/sending chips such as Wifi signal receiving/sending chips, Bluetooth signal receiving/sending chips, and ect.

Embodiment 1

Figure 2:
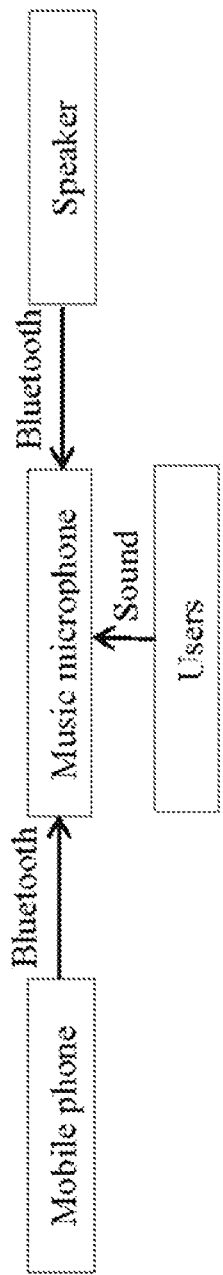
FIG. 2 is a working diagram of a multifunction wireless music microphone according to the disclosure.
Figure 3:
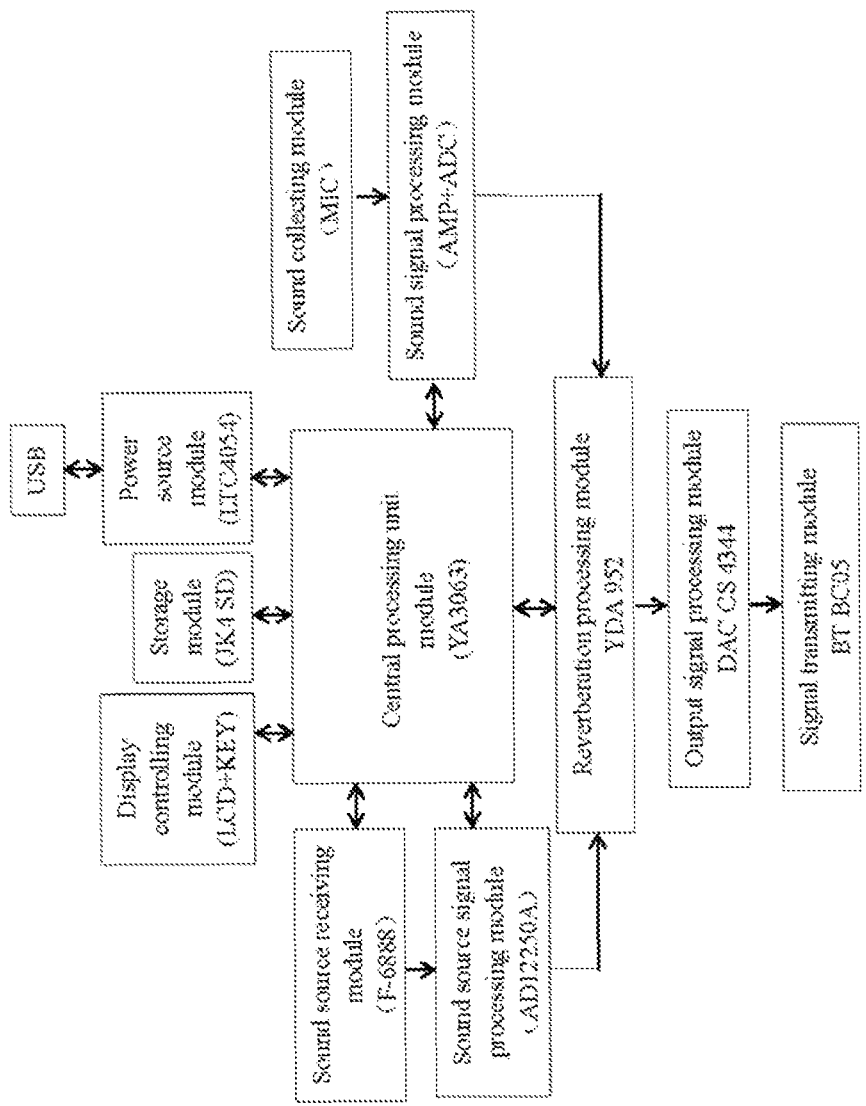
FIG. 3 is a circuit connection diagram of a multifunction wireless music microphone according to the disclosure.
Figure 4:
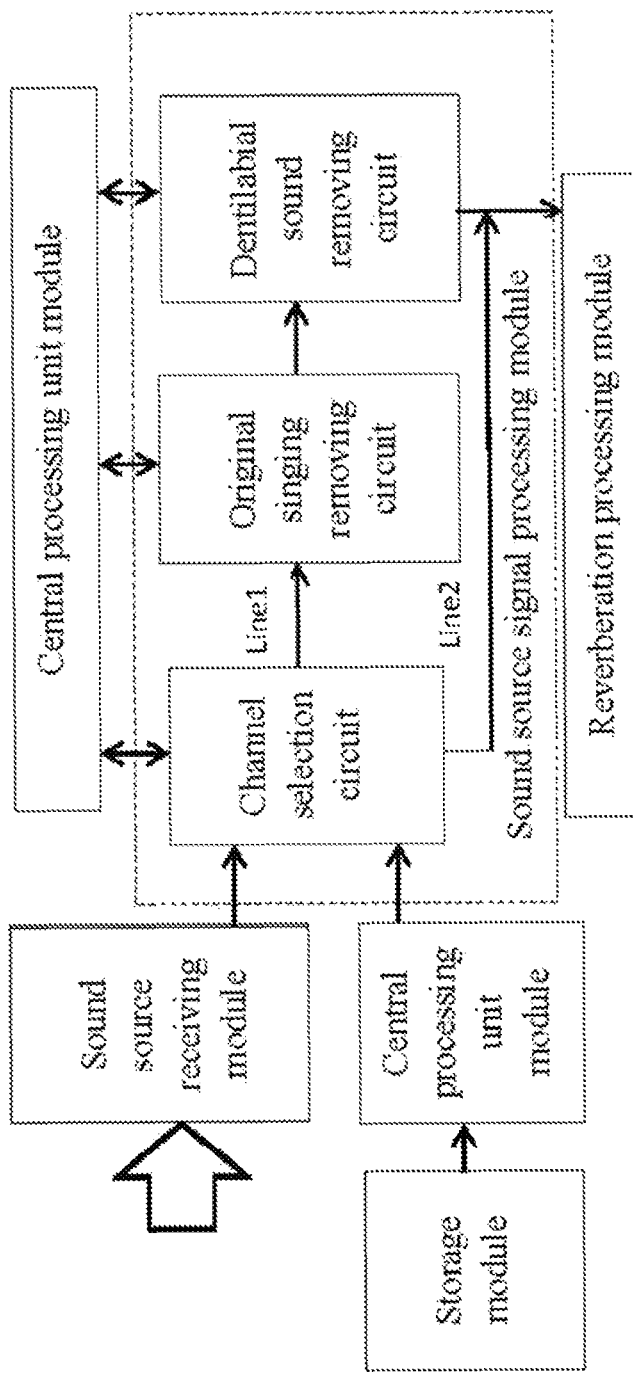
FIG. 4 is a structural diagram of a sound source signal processing module according to the disclosure.

Based on the principle diagram shown in FIG. 1, embodiment 1 showed in FIG. 2 and FIG. 3, provides a multifunction wireless music microphone. The sound source receiving module comprises a Bluetooth receiving circuit, and the signal transmitting module comprises a Bluetooth transmitting circuit. The multifunction wireless music microphone further comprises a storage module and a display controlling module. In actual operation, the multifunction wireless music microphone is connected to the mobile phone via the Bluetooth receiving circuit to receive music shared by the mobile phone. At the same time, the multifunction wireless music microphone is connected to speaker including car speaker via Bluetooth transmitting circuit, so as to achieve a high quality mixing of voice and music when the user speaks or sings through the microphone.

Specifically, the central processing unit module adopts an MCU with a type of YA3063, the sound source receiving module adopts a Bluetooth chip with a type of F-6888, the sound source signal processing module adopts an ADC chip with a type of AD12250A, the sound collecting module adopts a pickup microphone, the sound signal processing module includes an amplifying circuit based on SGM721 and an A/D circuit based on AD12250A, the reverberation processing module adopts a mixing DSP with a type of YDA952, the output signal processing module includes a D/A circuit based on CS4344, the signal transmitting module adopts a Bluetooth chip with a type of BC05, the storage module adopts a JK4 circuit to realize the reading of the SD card, the display controlling module adopts the combination of the LCD screen and the physical buttons, the power source module realizes charge directly through the USB interface based on the LTC4054 chip, and the display control module can also adopt a touch screen for replacing the combination of the LCD screen and the physical buttons.

Embodiment 2

Based on the principle diagram shown in FIG. 1, embodiment 2 is showed in FIGS. 4-12. Specifically, a sound source signal processing module of a multifunction wireless music microphone is showed in FIG. 4. The sound source signal processing module comprises a channel selection circuit and an original sound removing circuit. The channel selection circuit includes a selection controlling end, an external sound source receiving end, an internal sound source receiving end, a sound deadening output end, and a direct output end.

It should be noted that the selection controlling end is connected to the central processing unit module which chooses different channels depending on the user setting.

The external sound source receiving end is connected to the sound source receiving module for receiving the music via the wireless network from devices such as a mobile phone and a tablet computer.

The internal sound source receiving end is connected to the central processing unit module for receiving the music from the storage module.

The sound deadening output end is connected to the input end of the original sound removing circuit, while the output end of the original sound removing circuit is connected to the reverberation processing module, thereby the original sound removing circuit can remove or retain the original sound at different levels.

The direct output end is connected to the reverberation processing module, when users set original sound retained, the music will be send to the reverberation processing module directly via the channel.

It should be noted that the dentilabial sound removing circuit can be arranged after the original sound removing circuit depending on actual situation. The dentilabial sound removing circuit is functioned to reduce the disturbances and noises and hence improve the quality of accompaniment since some labials and dentals of singers will remain after the voice is removed and hence result to noises remaining in the accompaniment.

Figure 5:
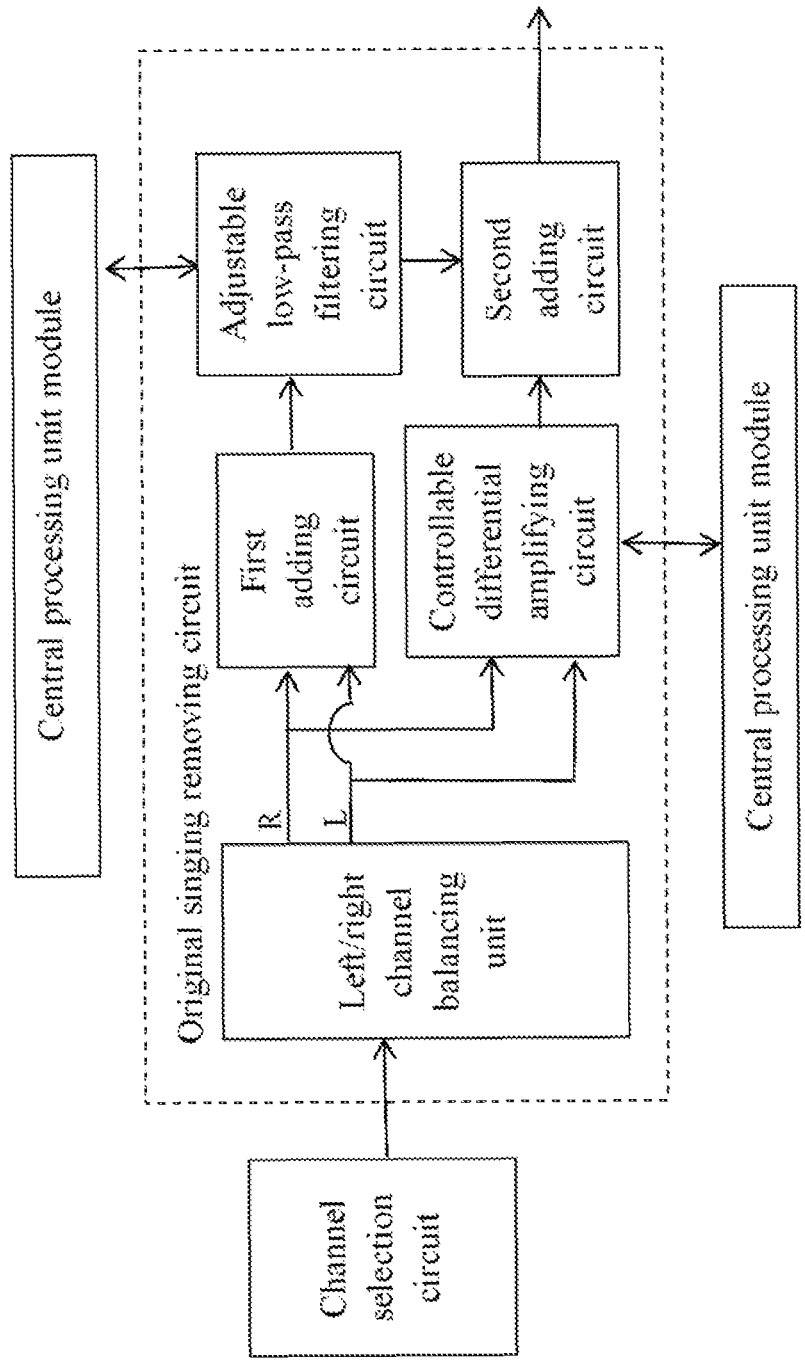
FIG. 5 is a structural diagram of an original sound removing circuit in the sound source signal processing module according to the disclosure.

Specifically, the original sound removing circuit showed in FIG. 5 can adopts hardware circuit or music processing chips as replacement.

It should be noted that the principle of the original sound removing circuit showed in FIG. 5 can concluded as follow: general music consists of the original sound and the accompaniment, the frequency of the original sound fall in the scope of median, while the frequency of the accompaniment is so wide that covers frequencies from low to high. The singer often positioned between the two-point main sound field for satisfying the requirement of balanced records between the left and right channels simultaneously. Namely the voltages on the left and right channels are substantially equal as well as their frequencies and phases. For the accompaniment, the voltages on the left and right channels are usually unequal because of the different performing positions and frequencies of instruments. Generally, some instruments of high and medium frequency will be concentrated on one channel. Therefore, the voltages recorded on the left and right channels vary greatly. Just like the original song information, some low frequency dominant instruments such as the drum kit are located in the central area, so the voltage recorded on the left and right channels are nearly equal.

As shown in FIG. 5, after the left and right signals of the music pass through the controllable differential amplifying circuit, the signals of singing voice and the low frequency dominant instruments are filtered, leaving the middle and high frequency signals of the accompaniment; meanwhile after the left and right signals pass through the first adding circuit and the adjustable low-pass filtering circuit, the signals of the low-frequency dominant instruments are let in the half-axis. Finally, these signals of the low frequency dominant instruments in the halt axis and the middle and high frequency signals of the half-axis pass through the second adding circuit together and then the complete accompaniment signal is output through the second adding circuit. In actual operation, the filter frequency of the adjustable low-pass filtering circuit and the amplification factor of the controllable differential amplifying circuit are in the control of the central processing unit module. And the filtration at different levels of the original sound in the music can be realized by changing the filter frequency of the adjustable low-pass filtering circuit.

Figure 6:
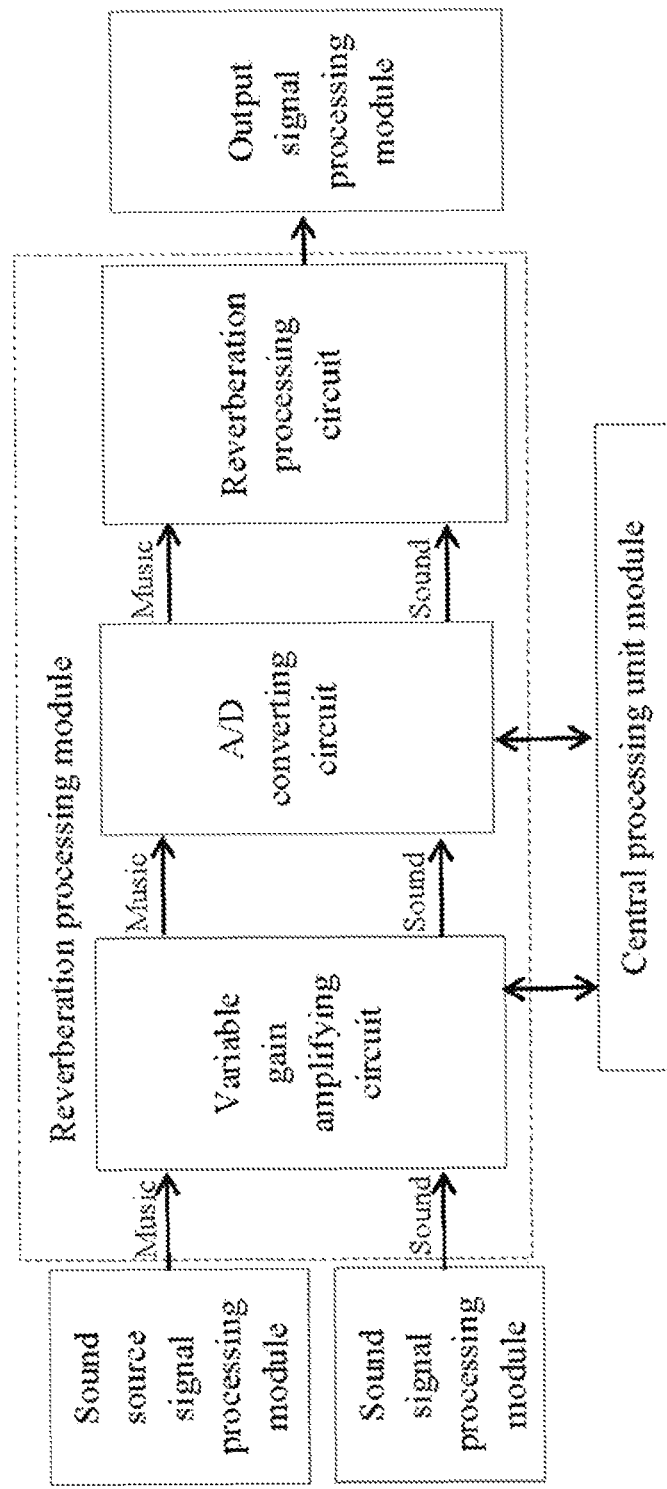
FIG. 6 is a structural diagram of a reverberation processing module according to the disclosure.

Specifically, the reverberation processing module showed in FIG. 6, comprises a variable gain amplifying circuit and a mixing processing circuit. The variable gain amplifying circuit comprises a gain controlling end, an accompaniment input end, a sound input end, an accompaniment output end, and a sound output end.

It should be noted that the gain controlling end is connected to the central processing unit module to change the enlarge scale of music and music signals according to users' setting. The accompaniment input end is connected to the sound source signal processing module. The sound input end is connected to sound signal processing module. The accompaniment output end is connected to a first input end of the mixing processing circuit. The sound output end is connected to a second input end of the mixing processing circuit, and the output end of the mixing processing circuit is connected to the output signal processing module. The mixing processing circuit realizes the mixing of multiple sound sources and prevents sound signals from exceeding the default thresholds.

The A/D converting circuit can further be added according to actual situation.

Figure 7:
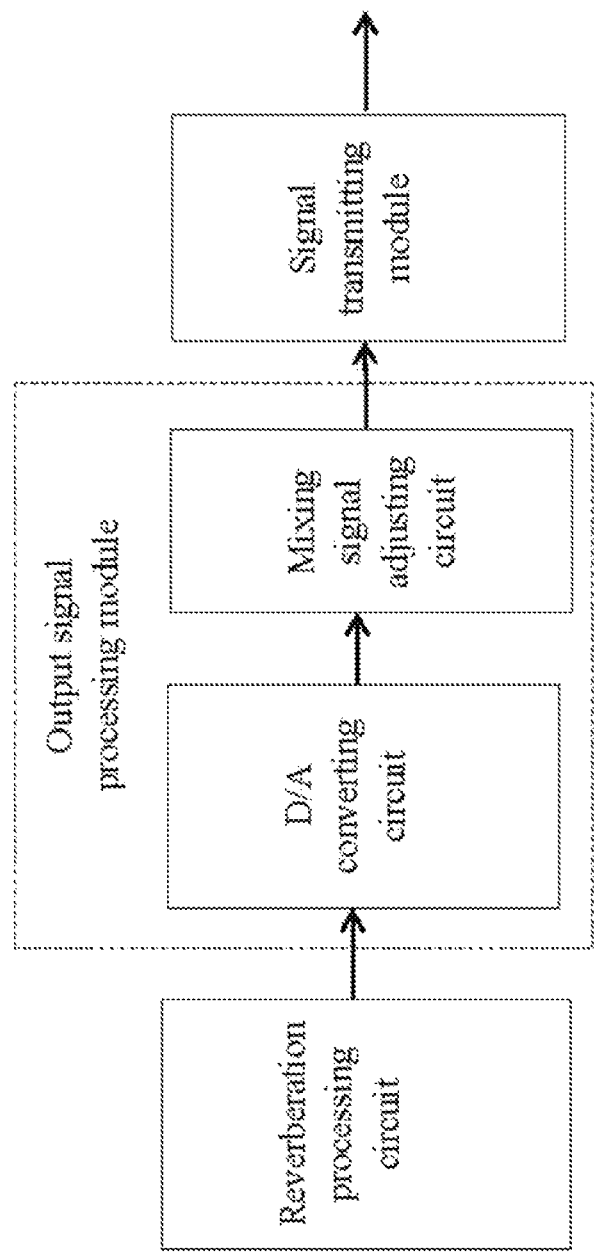
FIG. 7 is a structural diagram of an output signal processing module according to the disclosure.

Specifically, the output signal processing module showed in FIG. 7, comprises a D/A converting circuit and a mixing signal adjusting circuit. An input end of the D/A converting circuit is connected to the mixing processing circuit, and an output end of the D/A convening circuit is connected to the signal transmitting module via the mixing signal adjusting circuit.

Figure 8:
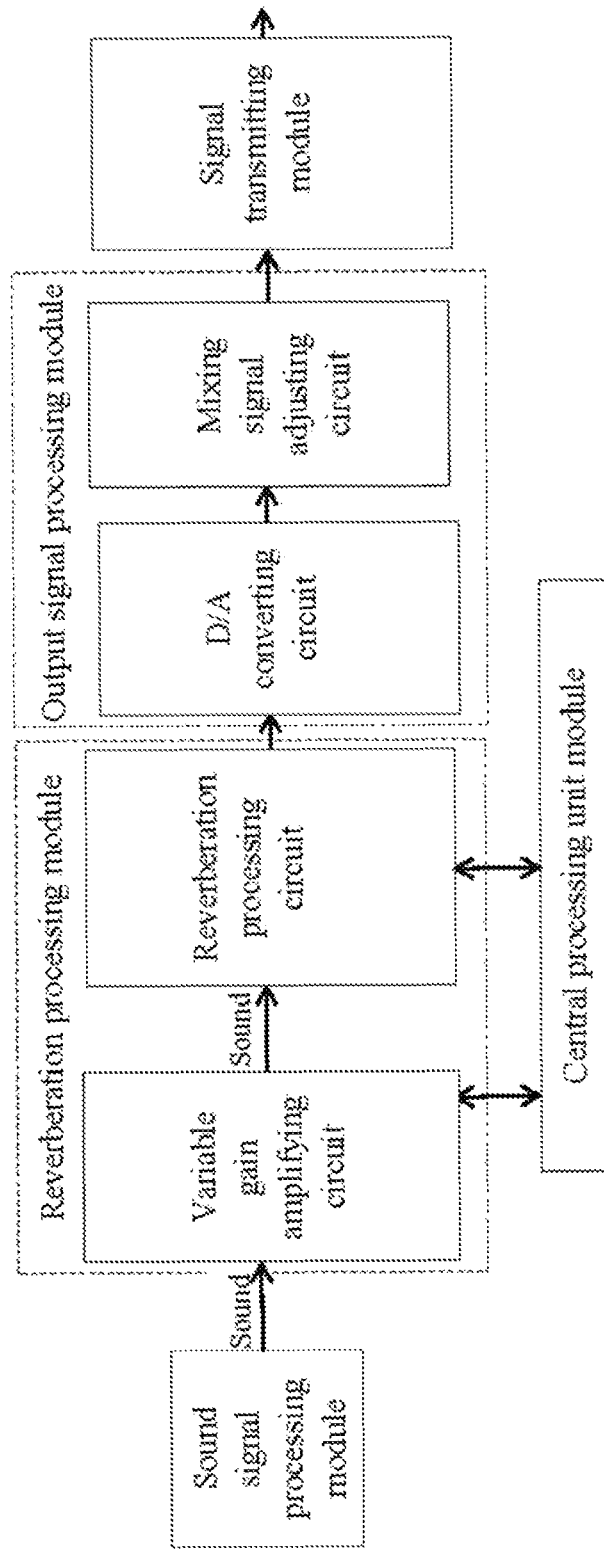
FIG. 8 is a working diagram of an amplifying mode of a multifunction wireless music microphone according to the disclosure.

In actual operation, the embodiment enables the microphone to change between four kinds of working modes: an amplifying mode, a mixing mode, an original sound accompaniment mode, and a pure accompaniment mode, and details are as follows:

1) The amplification mode: its working principles are showed in FIG. 8. In this mode, the user turns off the music signal, and the microphone will only polish, amplify and mix for the human voice to satisfy the user's demands for indoor presentation or conference discussion.

Figure 9:
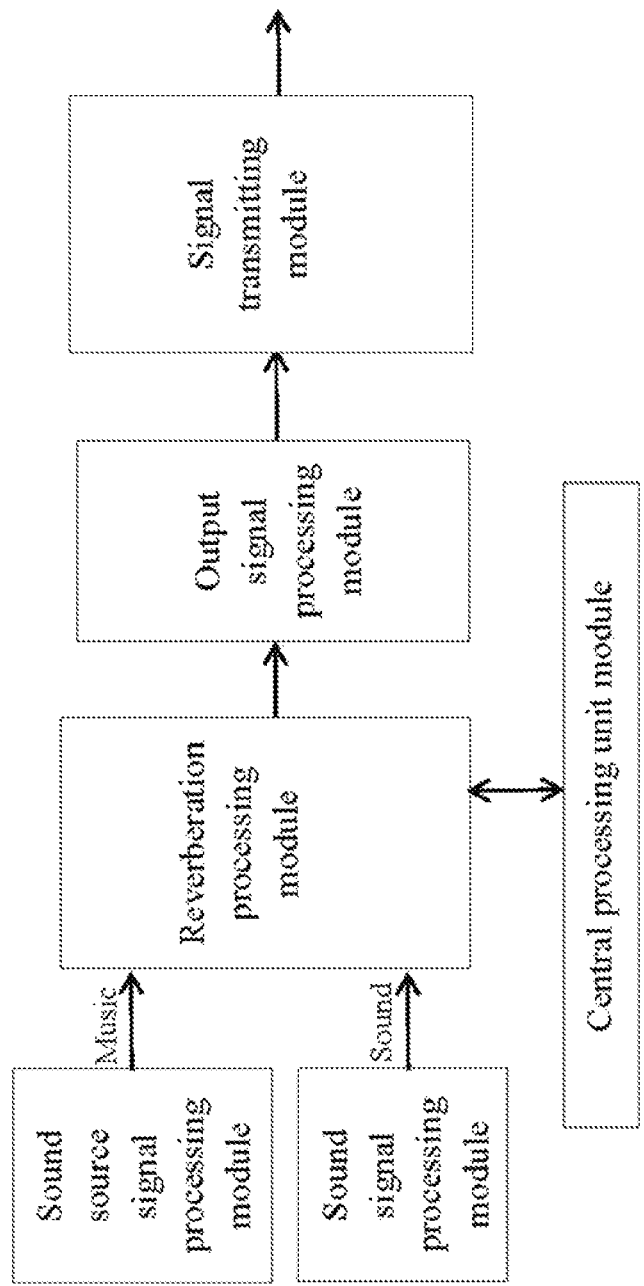
FIG. 9 is a working diagram of a first singing mode of a multifunction wireless music microphone according to the disclosure.

2) The mixing mode: its working principles are showed in FIG. 9. In this mode, the user turns on the music signal with the original sound removing function off, and the music and human voice are polished, amplified and mixed for meeting the needs of wedding, ritual and other speech dubbing.

Figure 10:
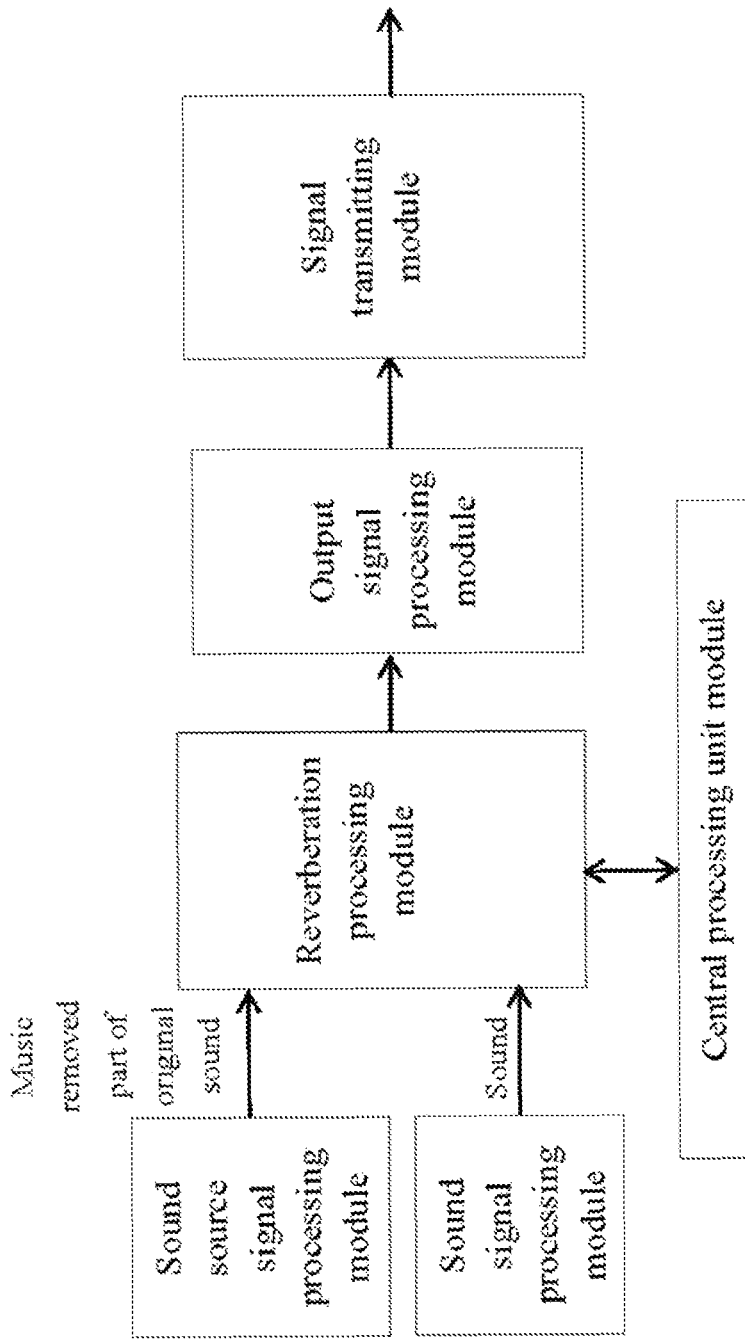
FIG. 10 is a working diagram of a second singing mode of a multifunction wireless music microphone according to the disclosure.

3) The original sound accompaniment mode: its working principles are showed in FIG. 10. In this mode, the user turns on the music signal and activates the original sound removing function. As a result, part of the original sound is removed with a small section remained, and the music removed part of the original sound and human voice are polished, amplified and mixed, thereby the user completes the singing smoothly with the help of the original sound remained, while the situation can be avoided where the original singing voice is louder over the user's voice, so as to meet the needs of singing in car speakers, Bluetooth speakers and other entertainment scenes.

Figure 11:
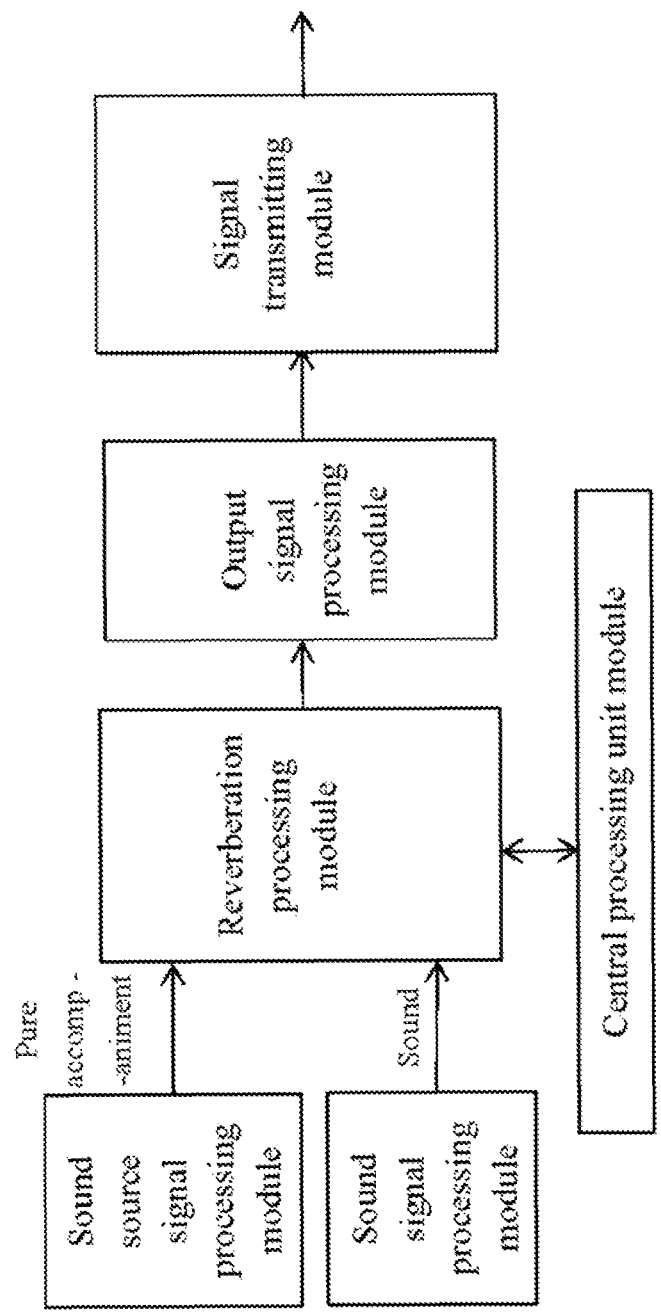
FIG. 11 is a working diagram of a third singing mode of a multifunction wireless music microphone according to the disclosure.

4) Pure accompaniment mode: its working principles are showed in FIG. 11. In this mode, the user turns on the music signal and activates the original singer removing function. As a result, the original sound is completely removed, and the pure accompaniment and human voice are polished, amplified and mixed to meet the needs of singing in car speakers, Bluetooth speakers and other entertainment scenes.

Figure 12:
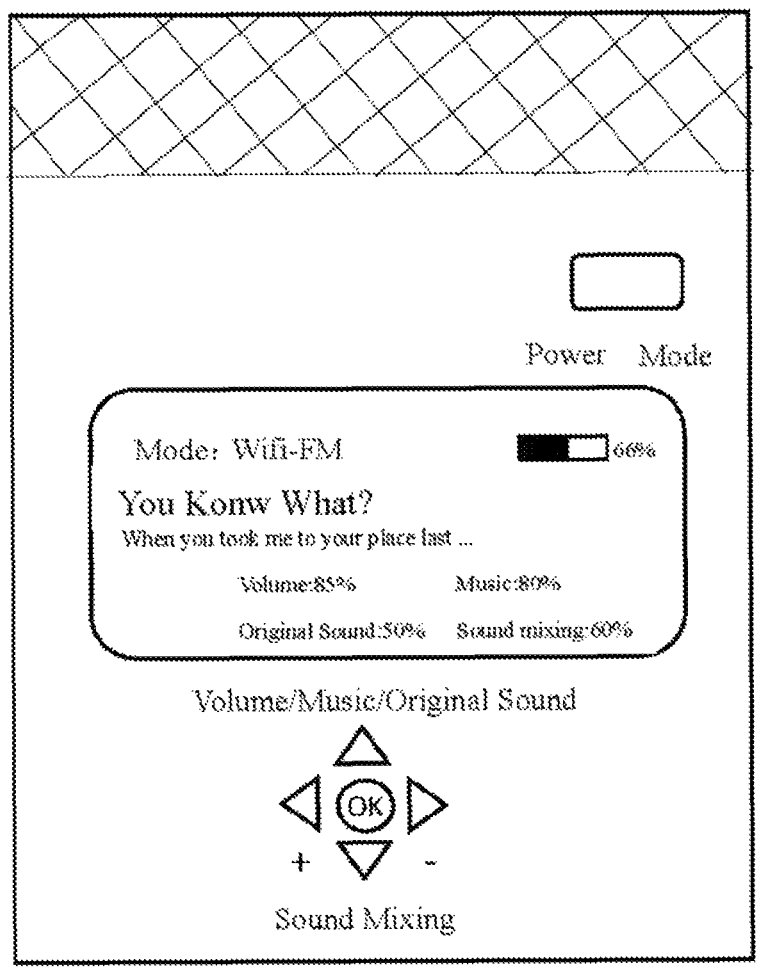
FIG. 12 is a appearance structural diagram of a multifunction wireless music microphone according to the disclosure.

The appearance structural diagram of a multifunction wireless music microphone according to the embodiment showed in FIG. 12, comprises the following four areas: a radio device area, a power/mode button area, an LCD display area, and a physical button controlling area. The radio device is equipped with a radio microphone. The power/mode button is a multifunction button, holding the button will turn off or turn on the microphone and touching the button can select different wireless communication modes. The LCD screen shows the current connection mode, the power information, the song information and adjustment values of the volume, the music, the original sound and the mixing. The physical button controlling area includes up, down, left, right four physical buttons, the up and down buttons are for object selection, the up button is for changing objects such as the volume, the music, the original sound, and mixing separately, and the down button activates the mixing object, then the values can be adjusted by touching the left and right physical buttons.

In the mode selection environment, the left and right physical buttons can also be used to select the connected wireless network. It should be noted that other physical buttons may be added or other functions may be added in the physical buttons shown in FIG. 12 according to actual conditions.

Embodiment 3

Figure 13:
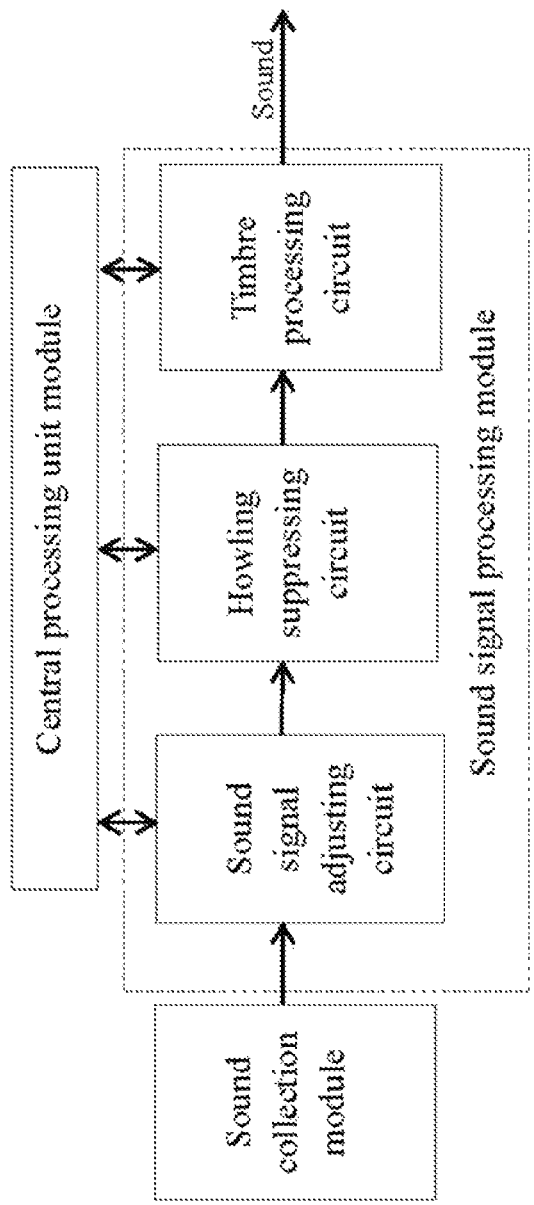
FIG. 13 is a structural diagram of the sound signal processing module according to the disclosure.

Based on embodiment 1 or 2, as shown in FIG. 13, the sound signal processing module of the multifunctional wireless music microphone may comprises a sound signal adjusting circuit, a howling suppressing circuit and a timbre processing circuit. The sound collecting module is connected to the sound input end of the reverberation processing module via the sound signal adjusting circuit, the howling suppressing circuit and the timbre processing circuit in sequence, so as to further optimize effects and quality of sound collection.

Embodiment 4

Figure 14:
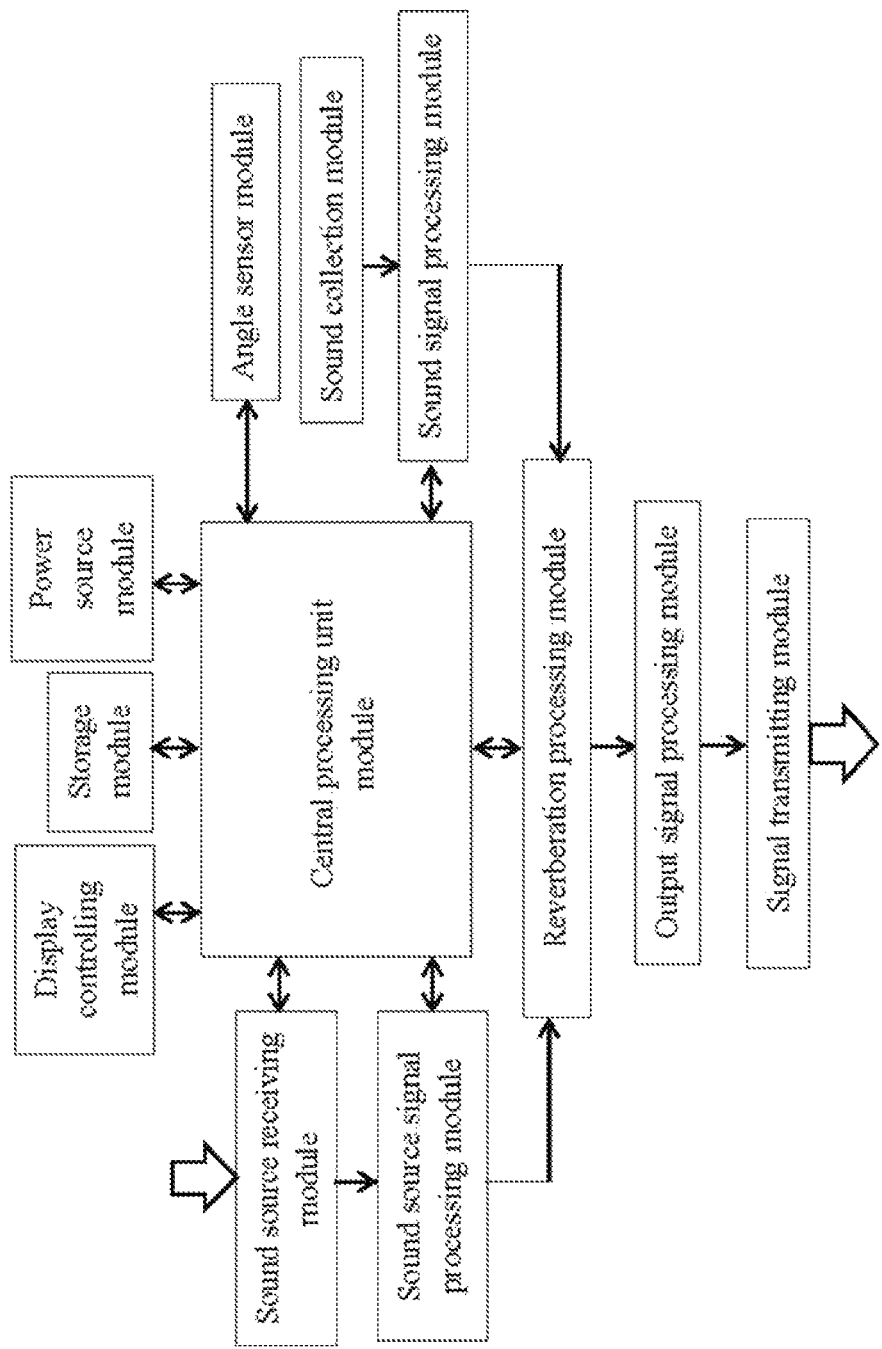
FIG. 14 is a modification of the multifunction wireless music microphone according to the present disclosure.

Based on embodiment 2 or 3, the multifunctional wireless music microphone further comprises an angle sensor module and a battery management module. The angle sensor module is connected to the central processing unit module and the battery management module is connected to the central processing unit module and the power source module, respectively, as showed in FIG. 14.

Specifically, the battery management module further comprises a protection circuit, a voltage sensor and a buzzer; a switch of the protection circuit is arranged between the power source module and an external charging power source; and the voltage sensor and the buzzer are connected to the central processing unit module, respectively.

In actual operation, the user can be in the control by shaking the microphone while singing, avoiding pauses caused by physical buttons or touch screen. For example, the user can realize the repeated playing by shaking the microphone twice, or switch to the next song by shaking the microphone three times (the song switching function), which further improves the interactive experience of the multifunction microphone. At the same time, the arrangement of the battery management module can fully protect the safety of the internal battery of the microphone and greatly extend the life of the battery. When the excessive charging or discharging fail to be processed in time, the buzzer works and realizes the alarm function.

The present disclosure provides a multifunctional wireless music microphone, and belongs to the fields of wireless communication and audio processing. The wireless music microphone comprises a central processing unit module, a sound source receiving module, a sound source signal processing module, a sound collecting module, a sound signal processing module, a reverberation processing module and a signal transmitting module. The sound source receiving module receives a song transmitted by devices such as a mobile phone and a tablet computer via a wireless network, the sound source signal processing module removes the original sound from the received music and retains the accompaniment according to a user setting; and a user sound, music or accompaniment is polished and mixed by the reverberation processing module, and is then sent to a loudspeaker box by the signal transmitting module via the wireless network. The multifunctional wireless music microphone provided in the present disclosure is applicable to various wireless communication modes and capable of mixing, amplifying and polishing the song and the user's sound effectively, so that the original sound of song can be adjustably removed; and the multifunction wireless music microphone can be widely applied to many scenarios, such as car loudspeaker box entertainment or outdoor loudspeaker box entertainment or indoor presentations or indoor conferences. Besides, the microphone equipped with the angle sensor module and the battery management module, thereby the user can be in the control by shaking the microphone while singing, avoiding pauses caused by physical buttons or touch screen and improving user experience.

The preferred embodiments have been detailed described above. It is appreciated that various improvements and modification may obtained by those skilled in the art without departing from the principle of this disclosure, and all these improvements and modification fall into the scope of the appended claims.

I claim:

1. A multifunctional wireless music microphone, comprising:
a central processing unit module, a sound collecting module, an output signal processing module, a signal transmitting module, a sound source receiving module, a sound source signal processing module, a reverberation processing module, a sound signal processing module, and a power source module; wherein the sound source receiving module, the sound source signal processing module, the reverberation processing module, the sound signal processing module and the power source module are connected to the central processing unit module respectively; the sound source receiving module is connected to a music accompaniment input end of the reverberation processing module via the sound source signal processing module; the sound collecting module is connected to a sound input end of the reverberation processing module via the sound signal processing module; an output end of the reverberation processing module is connected to the signal transmitting module via the output signal processing module; the sound source receiving module comprises one or more of the following receiving circuits: a Bluetooth receiving circuit, an FM receiving circuit and a Wifi receiving circuit; and the signal transmitting module comprises one or more of the following transmitting circuits: a Bluetooth transmitting circuit, an FM transmitting circuit and a Wifi transmitting circuit;
the sound source signal processing module comprises a channel selection circuit, an original sound removing circuit and a dentilabial sound removing circuit arranged after the original sound removing circuit; the channel selection circuit includes a selection controlling end, an external sound source receiving end, an internal sound source receiving end, a sound deadening output end, and a direct output end; the selection controlling end is connected to the central processing unit module; the external sound source receiving end is connected to the sound source receiving module; the internal sound source receiving end is connected to the central processing unit module for receiving music stored in the storage module; the sound deadening output end is connected to an input end of the original sound removing circuit; an output end of the original sound removing circuit is connected to the reverberation processing module; and the direct output end is connected to the reverberation processing module;

the original sound removing circuit comprises a left/right channel balancing unit, a first adding circuit, an adjustable low-pass filtering circuit, a controllable differential amplifying circuit and a second adding circuit; the left/right channel balancing unit includes a sound deadening input end, a left channel signal output end and a right channel output end; the right and left channel output ends each is connected to a first input end of the second adding circuit via the first adding circuit and the adjustable low-pass filtering circuit; the right and left channel input ends and the left channel signal input end each is connected to a second input end of the second adding circuit via the controllable differential amplifying circuit; an output end of the second adding circuit is connected to the accompaniment input end of the mixing processing circuit; and controlling ends of the adjustable low-pass filtering circuit and the controllable differential amplifying circuit are connected to the central processing unit module, respectively;

the dentilabial sound removing circuit includes an input end and an output end; the input end of the dentilabial sound removing circuit is connected to the output end of the original sound removing circuit; and the output end of the dentilabial sound removing circuit is connected to the accompaniment input end of the reverberation processing module.

2. The multifunctional wireless music microphone according to claim 1, further comprising: a storage module and a display controlling module: wherein the storage module and the display controlling module are respectively connected to the central processing unit module; the display controlling module is connected to a physical button, a display screen or a touch screen on the multifunctional wireless music microphone; and the storage module comprises one or more of the following read/write circuits: a USB read/write circuit, a TF card read/write circuit and an SD card read/write circuit.

3. The multifunctional wireless music microphone according to claim 1, wherein the reverberation processing module comprises a variable gain amplifying circuit and a mixing processing circuit; the variable gain amplifying circuit comprises a gain controlling end, an accompaniment input end, a sound input end, an accompaniment output end, and a sound output end; the gain controlling end is connected to the central processing unit module; the accompaniment input end is connected to the sound source signal processing module; the sound input end is connected to the sound signal processing module; the accompaniment output end is connected to a first input end of the mixing processing circuit; the sound output end is connected to a second input end of the mixing processing circuit; and an output end of the mixing processing circuit is connected to the output signal processing module.

4. The multifunctional wireless music microphone according to claim 3, wherein the sound signal processing module comprises a sound signal adjusting circuit, a howling suppressing circuit and a timbre processing circuit; the sound collecting module is connected to the sound input end of the reverberation processing module via the sound signal adjusting circuit, the howling suppressing circuit and the timbre processing circuit in sequence.

5. The multifunctional wireless music microphone according to claim 4, wherein the reverberation processing module comprises an A/D converting circuit connected between the variable gain amplifying circuit and the mixing processing circuit; the output signal processing module comprises a D/A converting circuit and a mixing signal adjusting circuit; an input end of the D/A converting circuit is connected to the mixing processing circuit; and an output end of the D/A converting circuit is connected to the signal transmitting module via the mixing signal adjusting circuit.

6. The multifunctional wireless music microphone according to claim 1, further comprising an angle sensor module and a battery management module, wherein the angle sensor module is connected to the central processing unit module and the battery management module is connected to the central processing unit module and the power source module, respectively.

7. The multifunctional wireless music microphone according to claim 6, wherein the battery management module comprises a protection circuit, a voltage sensor and a buzzer; a switch of the protection circuit is arranged between the power source module and an external charging power source; and the voltage sensor and the buzzer are connected to the central processing unit module, respectively.

* * * * *